US006770985B2

United States Patent
Yabe et al.

(10) Patent No.: US 6,770,985 B2
(45) Date of Patent: Aug. 3, 2004

(54) IN-VEHICLE ELECTRIC LOAD DRIVE/ CONTROLLING DEVICE INCORPORATING POWER MOSFET THERMAL PROTECTION

(75) Inventors: Hiroo Yabe, Shizuoka (JP); Hideharu Nagatomo, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/083,608

(22) Filed: Feb. 27, 2002

(65) Prior Publication Data

US 2002/0118502 A1 Aug. 29, 2002

(30) Foreign Application Priority Data

Feb. 28, 2001 (JP) ......................................... 2001-055280

(51) Int. Cl.[7] ................................................. H02H 3/93
(52) U.S. Cl. ...................... 307/117; 307/131; 361/93.8; 361/93.9
(58) Field of Search ............................... 307/117, 131; 36/93.8, 93.9

(56) References Cited

U.S. PATENT DOCUMENTS

| | | | | |
|---|---|---|---|---|
| 4,581,540 A | * | 4/1986 | Guajardo ..................... 307/117 |
| 5,187,632 A | * | 2/1993 | Blessing ....................... 361/93 |
| 5,550,702 A | * | 8/1996 | Schmidt et al. ................ 361/93 |
| 5,723,915 A | * | 3/1998 | Maher et al. ................. 307/131 |
| 5,847,593 A | * | 12/1998 | Pernyeszi ..................... 361/93 |
| 6,052,268 A | * | 4/2000 | Thomas ..................... 361/93.8 |
| 6,137,668 A | * | 10/2000 | Feldkeller .................. 361/93.8 |
| 6,205,010 B1 | * | 3/2001 | Ohsaka et al. .............. 307/117 |
| 6,356,423 B1 | * | 3/2002 | Hastings et al. ........... 361/93.9 |
| 6,381,114 B1 | * | 4/2002 | Mansfield .................... 307/131 |
| 6,590,757 B2 | * | 7/2003 | Pahl et al. ................. 361/93.9 |

FOREIGN PATENT DOCUMENTS

JP    2000-193692    7/2000

* cited by examiner

*Primary Examiner*—Jeffrey Sterrett
(74) *Attorney, Agent, or Firm*—Armstrong, Kratz, Quintos, Hanson & Brooks, LLP

(57) ABSTRACT

An in-vehicle load drive-control circuit including a power MOSFET between connected in series between a load and a power source, said power MOSFET on/off controlling the power supply to said load, said power MOSFET incorporating a thermoelectric element across which the voltage drops as a result at heat liberation when the power MOSFET is energized; and a control unit for ON/OFF controlling a gate driving signal to said power MOSFET on the basis of a voltage drop. After the voltage has been stabilized, the gate driving signal is made constant. In this configuration, the breakage of the MOSFET resulting from excess current can be inhibited in a simple structure.

10 Claims, 18 Drawing Sheets

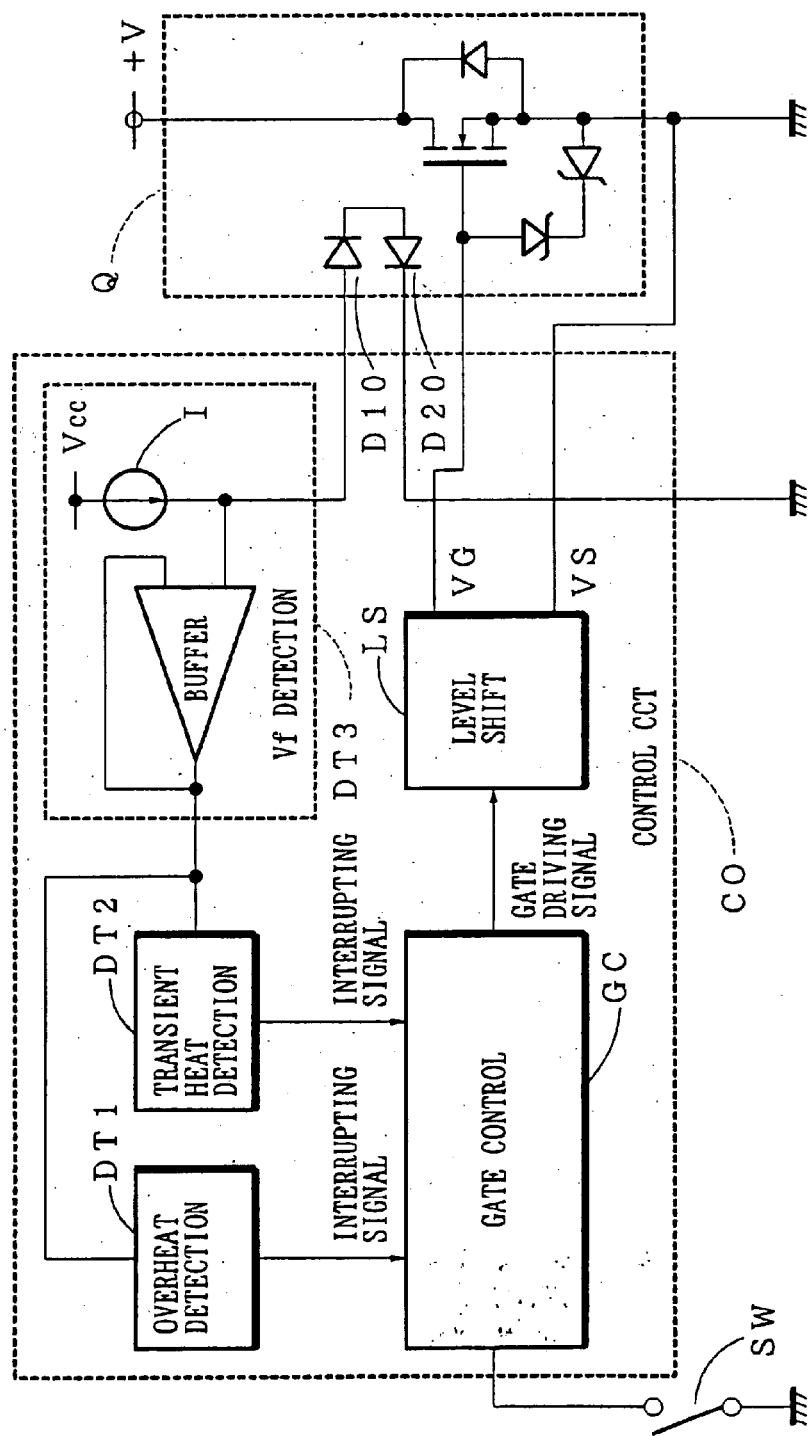
F I G. 2

IN-VEHICLE ELECTRIC LOAD DRIVE/ CONTROLLING DEVICE INCORPORATING POWER MOSFET THERMAL PROTECTION

BACKGROUND OF THE INVENTION

1. Field of the Invention

This invention relates to an in-vehicle load drive-controlling device for controlling energization of an in-vehicle electric load, and, more particularly, to an in-vehicle load drive-controlling device for protecting a power switching element such as a power MOSFET from an excessive current.

2. Description of the Related Art

A previously known circuit for protecting a power MOSFET for drive-controlling the in-vehicle electric load from an excessive current is disclosed in, e.g., JP-A-2000-193692 which proposes an excessive current detecting circuit and an excessive current detecting/protecting circuit.

FIG. 21 shows a circuit showing the structure of a conventional protecting circuit.

In FIG. 21, a series circuit composed of a reference resistance Rr and a reference MOSFET QB, which constitutes a reference circuit, is connected in parallel with a series circuit composed of a load L and power MOSFET QA. The reference resistance Rr and the reference MOSFET are equivalent to the load L and the power MOSFET QB, respectively. On the basis of a difference between the drain-source voltage of the reference MOSFET QB through which a reference current flows and that of the power MOSFET QA in which the current is varied by an excessive current, the excessive current flowing through the power MOSFET is detected.

Such an excessive current detecting circuit is implemented as an integrated circuit so that the reference MOSFET QB and the power MOSFET QA are formed on the same chip by the same process and both of them are composed of a plurality of transistors.

In a conventional excessive current detecting circuit, because the power MOSFET QA, which is a switching element, and a reference power MOSFET QB, which is also a switching element, are integrated to form an IC excessive current detecting circuit, the structure of each element is complicated and the control circuit therefore is also complicated.

In the circuit diagram of FIG. 21, if there is a difference between the ground potential of the load L and that of the reference resistor Rr, an error in the detected current is generated. This makes it impossible to protect the switching element from an excessive current.

The gate control circuit for the power MOSFETs QA and QB, which includes MOSFETs Q1 and Q2, a comparator CP, etc., and a loadine are coupled with each other by a terminal T3. Therefore, the control circuit may malfunction or may be broken due-to as a result of the noise from the load line.

SUMMARY OF THE INVENTION

This invention has been accomplished in order to overcome such an inconvenience.

An object of the present invention is to provide an in-vehicle electric load drive-controlling device which can be simplified in circuit configuration and improved in safety and reliability from the viewpoint of protection from excessive current and exclusion of influence of external noise.

In order to attain the above object as seen from FIG. 1A, in accordance with the present invention, there is provided an in-vehicle load drive-control circuit comprising:

a power MOSFET between connected in series between a load L and a power source B, the power MOSFET on/off controlling the power supply to the load, the power MOSFET incorporating a thermoelectric element D across which the voltage drops as a result of heat liberation when the power MOSFET is energized; and a control means COT for ON/OFF controlling a gate driving signal to the power MOSFET on the basis of a voltage drop, wherein after the voltage has been stabilized, the gate driving signal is made constant.

In this configuration, the temperature change of the thermoelectric element incorporated in the power MOSFET is detected in terms of a voltage change to detect heat liberation as a result of a current flowing through the MOSFET, and a gate driving signal to the power MOSFET is ON/OFF controlled and is made constant after the voltage of the thermoelectric element has been stabilized. This configuration inhibits the breakage of the MOSFET due to excess current in a simple structure.

Preferably, the control means comprises a rush current detecting unit DT11 for detecting a rush current to the load on the basis of a time changing rate of the voltage drop to produce an interrupting signal for the gate driving signal to the power MOSFET.

In this configuration, when the abrupt voltage drop across the thermoelectric element is detected as a result of the rush current flowing through the load which is ten times as large as the rated current when the power supply to the load is initially turned on, the gate driving signal is interrupted, and after the voltage across the thermoelectric element rises to the stationary level, the gate driving signal is produced. Such a configuration inhibits the breakage of the MOSFET due to the excess rush current when the power MOSFET is initially turned on.

Preferably, the control means comprises an abnormal current detecting unit DT12 for deciding an excess current due to poor wiring when the number of times of detecting the rush current by the rush current detecting unit is more than a prescribed number to produce an interrupting signal for the gate driving signal to the power MOSFET.

In this configuration, if the abrupt voltage drop across the thermoelectric element is detected whenever the gate driving signal is supplied to the power MOSFET, under the decision that this is attributed to short-circuiting of the wiring, the gate driving signal to the power MOSFET is interrupted. Such a simple configuration inhibits the breakage of the power MOSFET due to the excess current when the wiring is short-circuited Preferably, the rush current detecting unit DT11 produces the gate driving signal at intervals while a load current is suppressed to less than a prescribed current after the voltage across the thermoelectric element has dropped to a prescribed voltage to repeat an ON/OFF operation of the power MOSFET so that the voltage is increased by a certain degree by heat dissipation of the power MOSFET.

In this configuration, heat concentration to the thermoelectric element is diffused to increase the voltage by a certain degree. Thus, the restoration of the operation of the power MOSFET can be performed instantaneously and smoothly.

Preferably, the rush current detecting unit produces the gate driving signal at intervals while a load current is suppressed to less than a prescribed current after the voltage across the thermoelectric element has dropped to a prescribed voltage to repeat an ON/OFF operation of the power MOSFET is repeated and ON/OFF operation of energization of a load so that heat liberation of the load is stabilized to make resistance constant.

In this configuration, the rush current due to the initial low resistance of the load can be inhibited and the restoration of the operation of the power MOSFET can be performed instantaneously and smoothly.

Preferably, the control unit includes an overheat detecting unit DT13 for detecting an overheat abnormality of the power MOSFET when the voltage drops to produce an interrupting signal for the gate interrupting signal.

In this configuration, the excess current supplied to the power MOSFET can be detected in a simple structure, and breakage of the power MOSFET due to the excess current can be inhibited.

Preferably, the overheat detecting unit DT13 decides restoration of the overheat abnormality of the power MOSFET when the voltage rises, thereby producing the gate driving signal.

In this configuration, the restoration of the power MOSFET can be performed smoothly.

Preferably, the thermoelectric element D is a diode whose forward voltage increases with an increase in an ambient temperature. In this configuration, since the diode can be manufactured on the same pellet in the same manufacturing step as the MOSFET, the overheat of the MOSFET due to the excess current can be effectively detected.

Preferably, as seen from FIG. 1B, the in-vehicle load drive controlling device further includes a plurality of power MOSFETs Q1 to Q4 for driving a plurality of loads LM1 to LM4, respectively, and the control unit supplies gate driving signals at slight intervals over time to the gates of these MOSFETs.

In this configuration, the currents on the power source lines are averaged so that the burden for the battery and the loss of the current lines is reduced. The radiation noise due to a current change can be also reduced.

Preferably, the control unit supplies the gate-driving signal based on a PWM signal to the power MOSFET.

In this configuration, the power source voltage can be adjusted to the voltage level of the load by controlling the duty ratio of the PWM signal. After the rush current has been detected, the gate driving signal is intermittently supplied to the power MOSFET on the basis of the PWM signal without performing a timer operation.

The above and other objects and features of the invention will be more apparent from the following description taken in conjunction with the accompanying drawings.

BRIEF DESCRIPTION OF THE DRAWINGS

FIG. 2 is a block diagram of the in-vehicle electric load drive-controlling device according to the first embodiment of this invention;

DESCRIPTION OF THE PREFERRED EMBODIMENTS

Embodiment 1

Figures 1A, 1B:
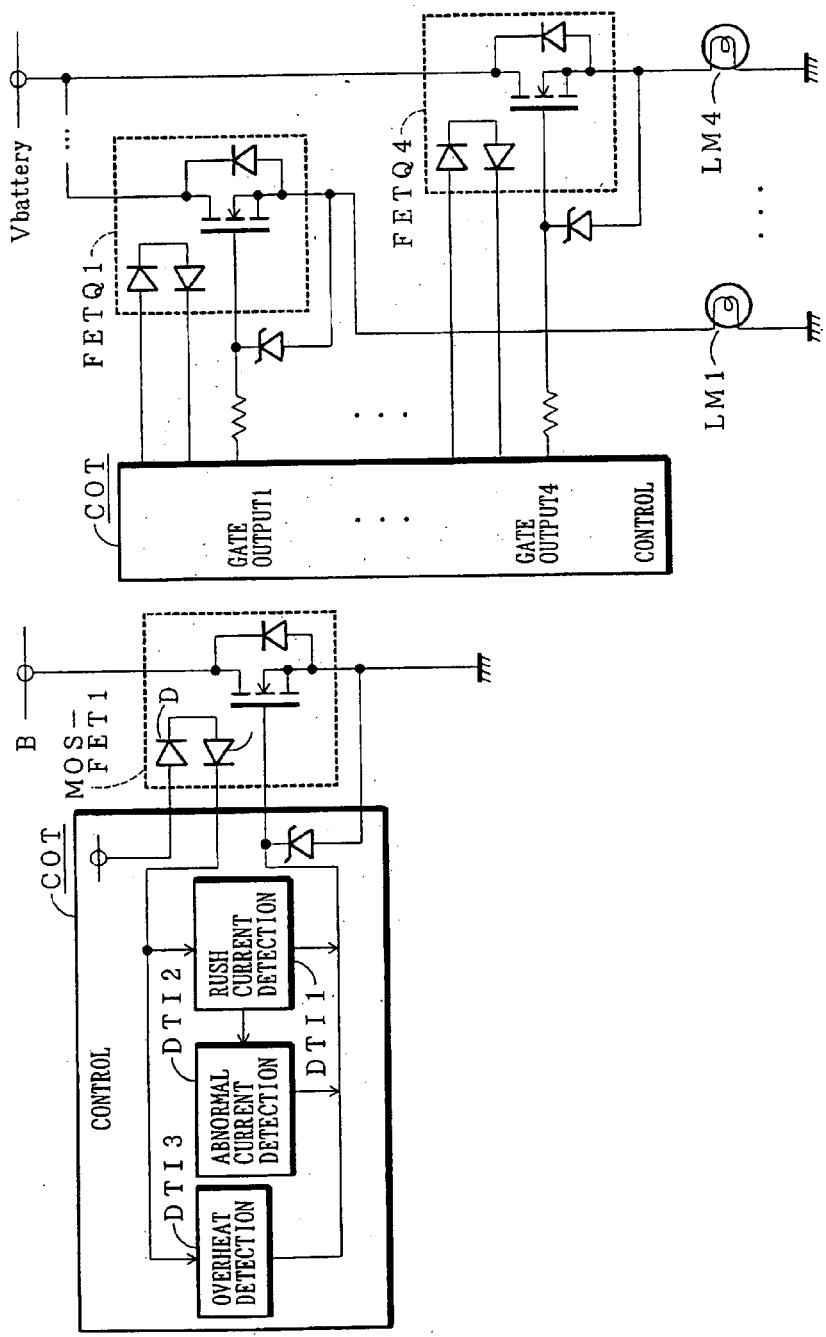
FIGS. 1A and 1B are circuit diagrams each showing the basis configuration of the in-vehicle electric load drive-controlling device according to this invention.

Now referring to the drawings, an explanation will be given of this embodiment. FIG. 2 is a block diagram of the in-vehicle electric load drive-controlling device according to the first embodiment of this invention.

As seen from FIG. 2, this device includes a power MOSFET Q, a control circuit CO and a switch SW. The power MOSFET Q as well as a load L is connected between the "+" terminal of an in-vehicle battery B and ground, and incorporates temperature detecting diodes D10 and D20 in a series connection (series-connected diodes). The control circuit CO serves to supply a control signal to the power MOSFET Q and perform the transient heat protection, overheat protection and excessive current protection for the power MOSFET Q on the basis of the forward voltage Vf of the series connected D1, D2 the forward voltage of which is varied due to heat liberation of the MOSFET. The switch SW serves to supply a load driving signal to the control circuit CO.

Figure 3:
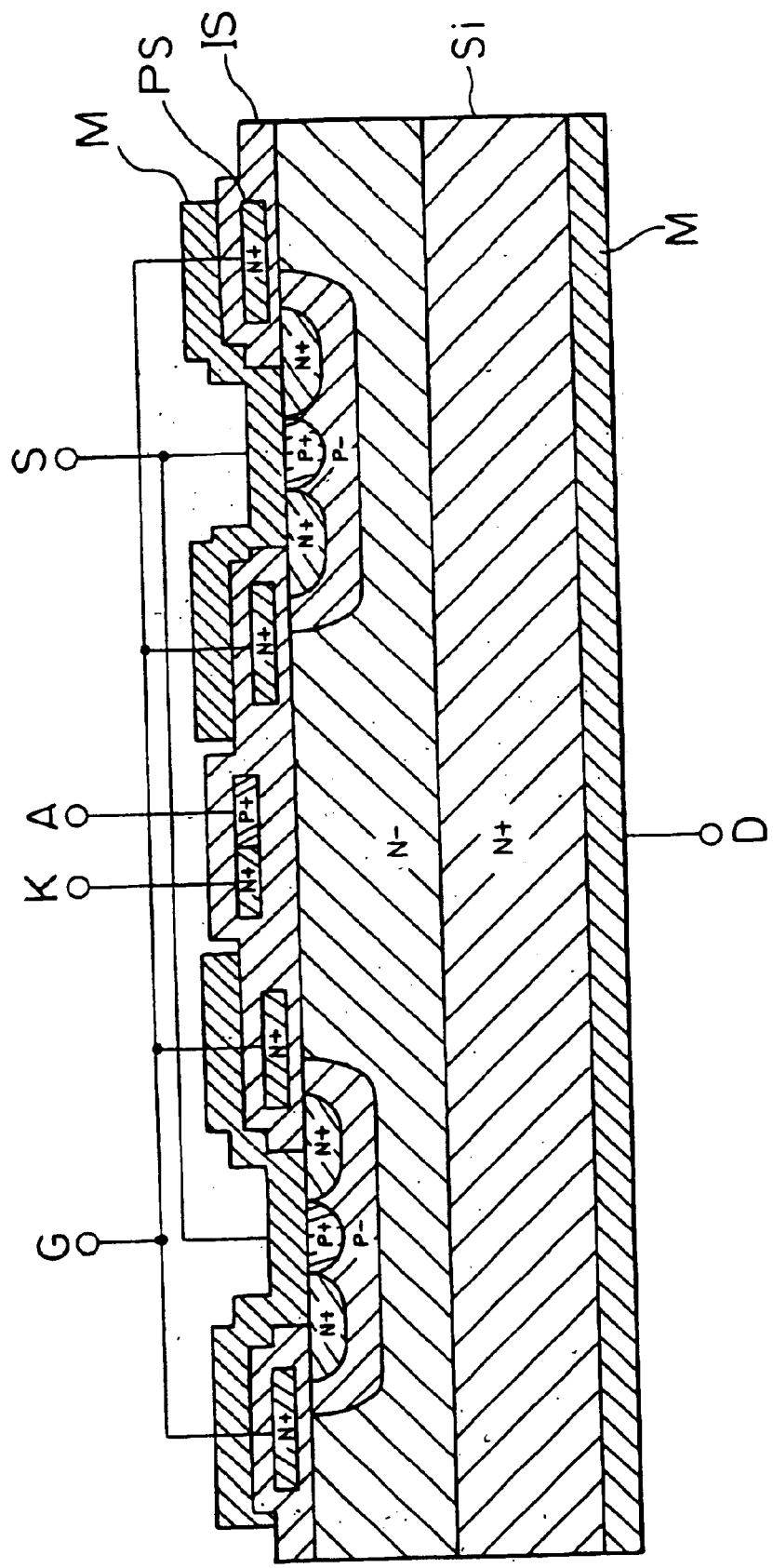
FIG. 3 is a sectional view of the MOSFET incorporating a temperature-detecting diode for use in the in-vehicle electric load drive-controlling device according to this invention.

The power MOSFET Q according to this embodiment may be a vertical DM05 configured MOSFET, as shown in FIG. 3.

As shown in FIG. 3, a Si semiconductor substrate is composed of two n type layers N+ and N−. A metallic wiring M is deposited on the rear surface of the n type layer N+. A drain electrode is formed on the metallic wiring M.P−well regions are formed apart from each other in the surface of the n type layer N−. Within each of the P−well regions, two N+well regions are formed so as to sandwich a P+well.

In each of the P− well regions, a gate electrode of poly-Si PS is formed on a gate region extended to the individual N+ well region through an insulating film IS. The gate electrode is connected to a gate terminal G through a lead wire. In each of the P− well regions, a metallic wiring is deposited on the N+, P+, N+ well regions on which the insulating film is not deposited and on the insulating layer IS deposited on the gate regions formed on left and right sides, thereby providing a source electrode. The two source electrodes thus formed are connected to a source terminal S. In each of the P− well regions, a diode consisting of the N+ (cathode) and P+ (anode) poly-Si film is formed on the n type layer N− through the insulating film IS.

A single or plural diodes connected in series having small thermal resistance and thermal capacity are formed so as to provide good response to the heat generated in the power MOSFET.

The diode is electrically insulated from the gate electrode and source electrode which form the switch element. Therefore, there is less danger that transmission noise is conducted from the load line connected to the source electrode to the control circuit.

The power MOSFET may be formed in a U-groove structure or V-groove structure. Further, the diode may be formed in the N− layer by diffusion. The power MOSFET is designed to operate in a linear zone during a normal operation and a saturated zone when there is a rush current into the in-vehicle lamp or abnormality of wiring short-circuiting. When a large current tends to flow through the diode, the current is restrained to a set value since the MOSFET is shifted into the saturated zone.

At this time, the drain-source voltage increases to amplify the heat liberation within the MOSFET. The heat conducts to the incorporated diode to lower Vf (forward voltage). The abnormal liberated heat is detected on the basis of the reduced amount of the forward voltage Vf. The MOSFET shifts to the saturated zone when the drain-source voltage Vds satisfies the following condition.

$$Vds=Vgs-Vt$$

Vgs: gate-source voltage of MOSFET
Vt: operating threshold voltage of MOSFET

Such a characteristic can be acquired by controlling Vgs and Vt to appropriate values and also the MOSFET so as to satisfy the following condition.

$$Vds=Rdson \times ILlim$$

Rdson: on resistance of the MOSFET

Specifically, in view of the characteristic equation of the MOSFET, the parameter of the MOSFET is adapted to provide the condition $Illim=0.5 \; k(Vgs=Vt)^2$ (k: transfer function).

Figure 8:
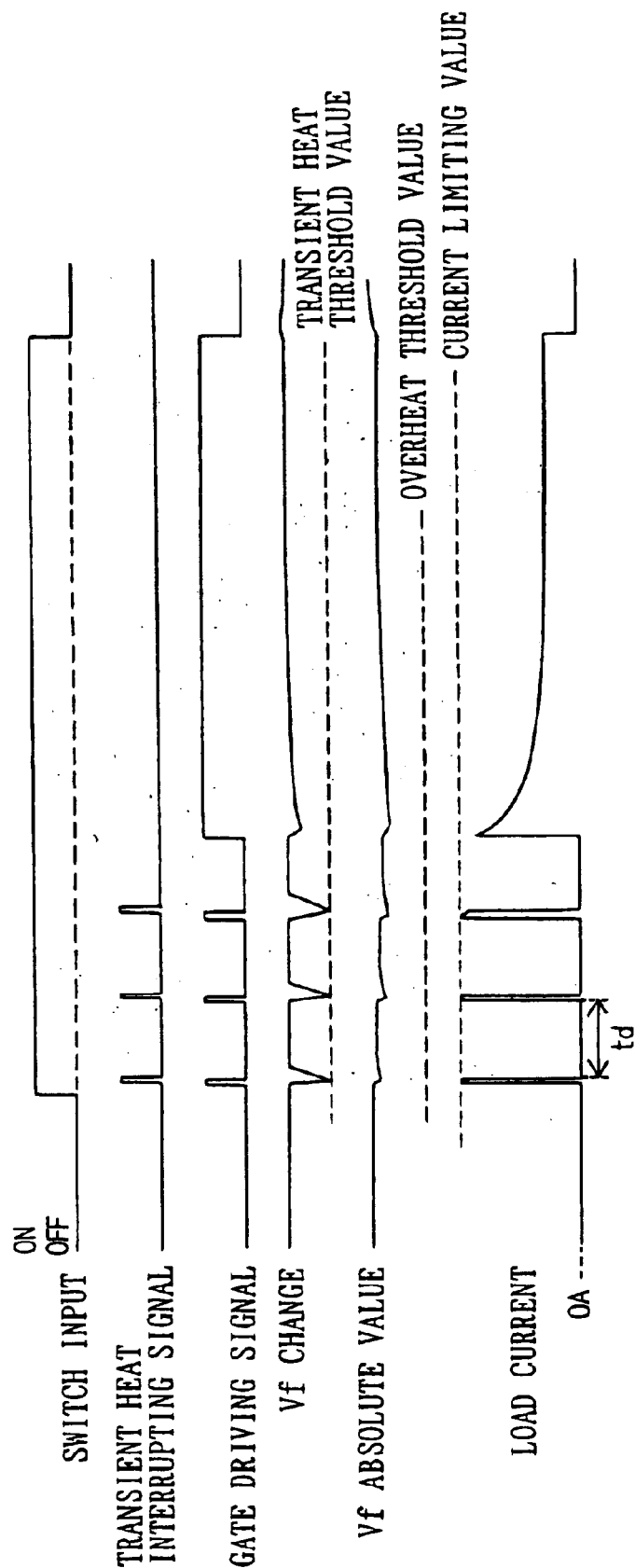
FIG. 8 is a waveform chart of control timings based on a variation of Vf when a rush current is limited in the first embodiment.
Figure 10:
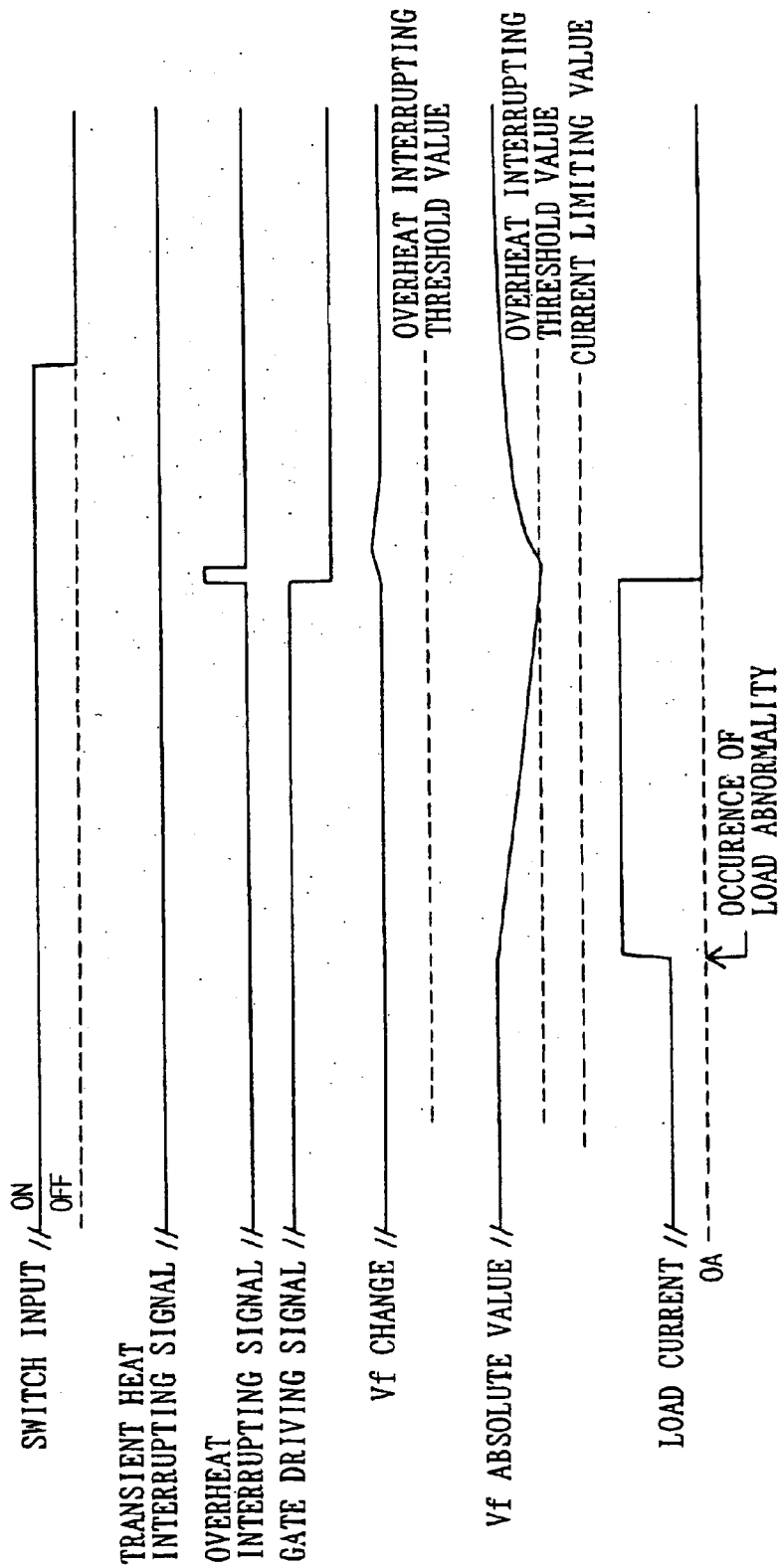
FIG. 10 is a waveform chart of timings of protection from overheat by the absolute value of Vf in the first embodiment.

In order to satisfy the above condition, the circuit CO for controlling the gate voltage VG and source voltage VS of the MOSFET Q includes a constant current circuit I, a Vf detecting circuit DT3, an overheating detecting circuit DT1, a transient heat detecting circuit DT2 and a level shift circuit LS. The constant current circuit I supplies a constant current to the diodes D10 and D20 built in the MOSFET Q. The Vf detecting circuit DT3 includes a buffer amplifier for detecting the forward voltage across the diodes D10, D20 in a state where the forward current is being supplied to the diodes D10, D20 from the constant current circuit I. The overheating detecting circuit DT1 detects the overheat abnormality when the absolute value of the forward voltage Vf detected by the Vf detecting circuit DT3 becomes lower than the overheat interrupting threshold voltage set, as shown in FIG. 10, thereby supplying an overheating abnormality interrupting signal to a gate control circuit GC. The transient heat detecting circuit DT2 supplies a transient heat interrupting signal to the gate control circuit GC when the time change of the forward voltage Vf exceeds the transient heat interrupting threshold value as shown in FIG. 8. The level shift circuit LS boosts the potential of the gate driving signal produced from the gate control circuit GC to a level higher than the battery voltage to be supplied to the drain of the MOSFET and supplies Vgs thus obtained between the gate and source of the MOSFET.

Figure 9:
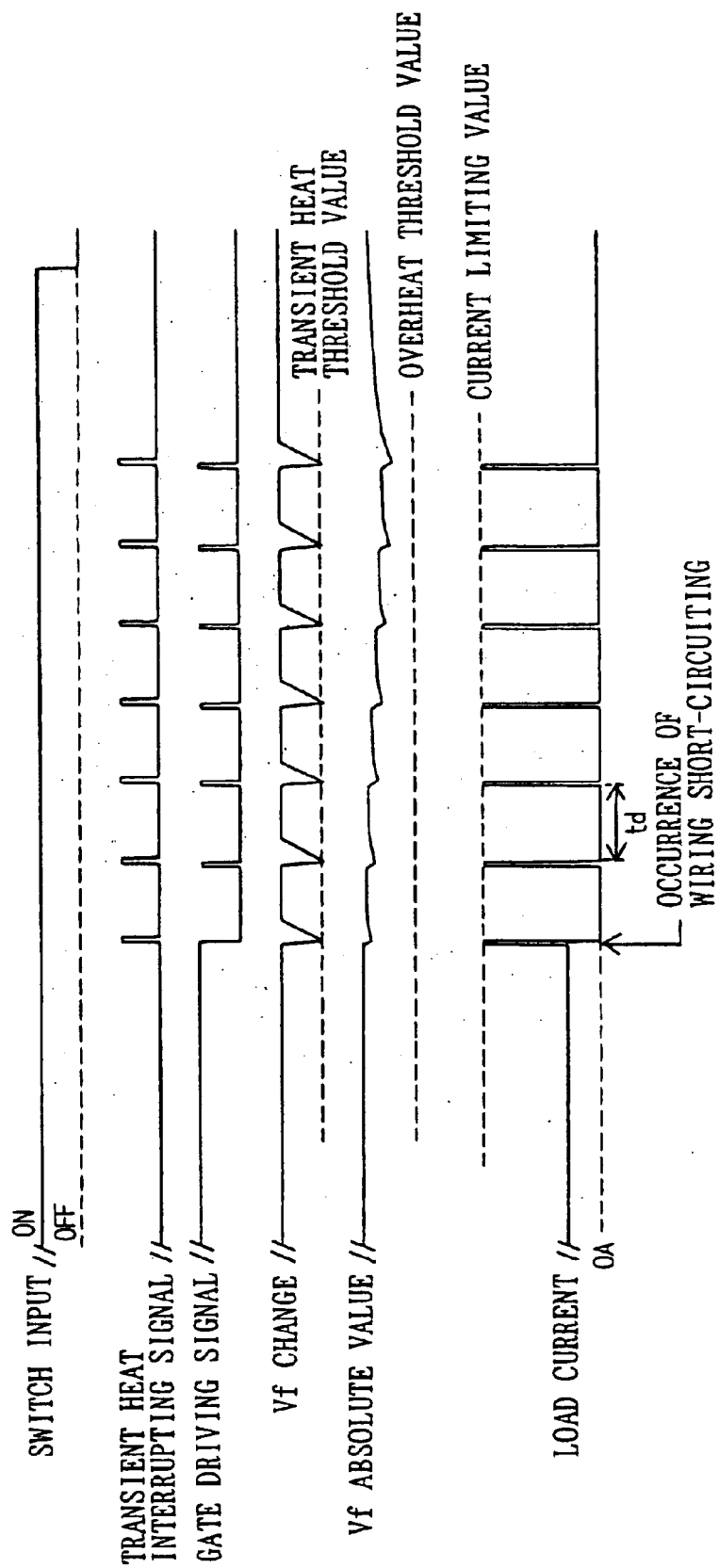
FIG. 9 is a waveform chart of control timings based on a variation of Vf when the protection from short-circuiting is performed in the first embodiment.

Although not shown, the control circuit CO counts the transient heat interrupting signal produced from the transient heat interrupting detecting circuit DT2, thereby producing an abnormal current interrupting signal based on the counted value as shown in FIG. 9.

Figure 6:
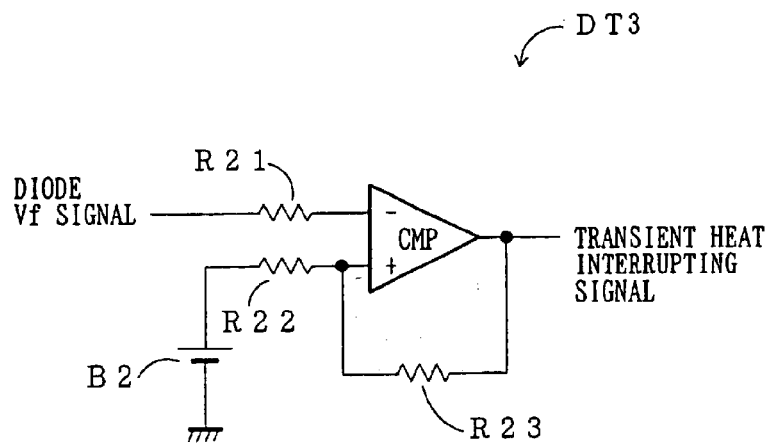
FIG. 6 is a circuit diagram of an overheat detecting circuit shown in FIG. 2.

The overheat detecting circuit DT1 is configured as shown in FIG. 6 so that the absolute value (Vf absolute value) of the forward voltage across the diode is applied to the inverting input terminal (−) of a comparator CMP equipped with a hysteresis function, which may be an operational amplifier, through a resistor R21, and a reference voltage Vrf (voltage for deciding overheat abnormality of the MOSFET) is applied to the non-inverting input terminal (+) through a resistor 22. In such a circuit, if the Vf absolute value becomes lower than the reference voltage Vrf, the output from the comparator CMP becomes "H" level, thus producing the overheat interrupting signal.

When the Vf absolute value rises again, the overheat interrupting signal which is an output from the comparator CMP will be inverted. However, the comparator CMP can prevent the noise component from being mixed with the output from the VF detecting circuit DT3 and the Vf absolute value from exceeding the reference voltage Vrf so that the overheat interrupting signal is not inverted into the L level. In this meaning, the comparator has a function of the hysteresis.

Specifically, when the output from the comparator CMP becomes "H" level, this output is fed back via a resistor R23. Therefore, the reference voltage rises by the voltage drop across the resistors R22 and R23. As a result, when the Vf absolute value exceeds the reference voltage level (hysteresis component), the overheat interrupting signal is first inverted into the L level, thereby turning off the overheat interrupting signal.

Figure 5:
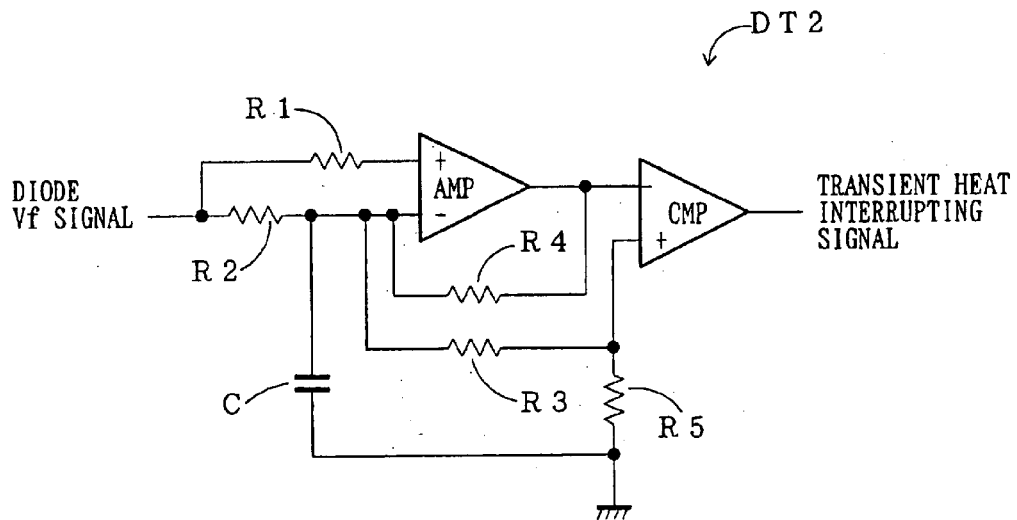
FIG. 5 is a circuit diagram of a transient heat detecting circuit shown in FIG. 2.

The transient heat detecting circuit DT2 is configured as shown in FIG. 5. This circuit produces a transient heat interrupting signal when the time change in the Vf signal exceeds a prescribed value.

In operation of this circuit, the input diode Vf signal, which is an analog signal varying with passage of time, is stored as the passed value by a filter circuit composed of a resistor R2 and a capacitor C. The present value of Vf is inputted to the non-inverting input terminal (+) of an operational amplifier AMP, whereas the passed component stored in the filter is inputted to the non-inverting terminal (−) thereof. Therefore, in the operational amplifier AMP, a difference between the present value and the passed value in Vf is amplified with an amplification factor defined by a combination of resistors R1 to R5.

Figure 7:
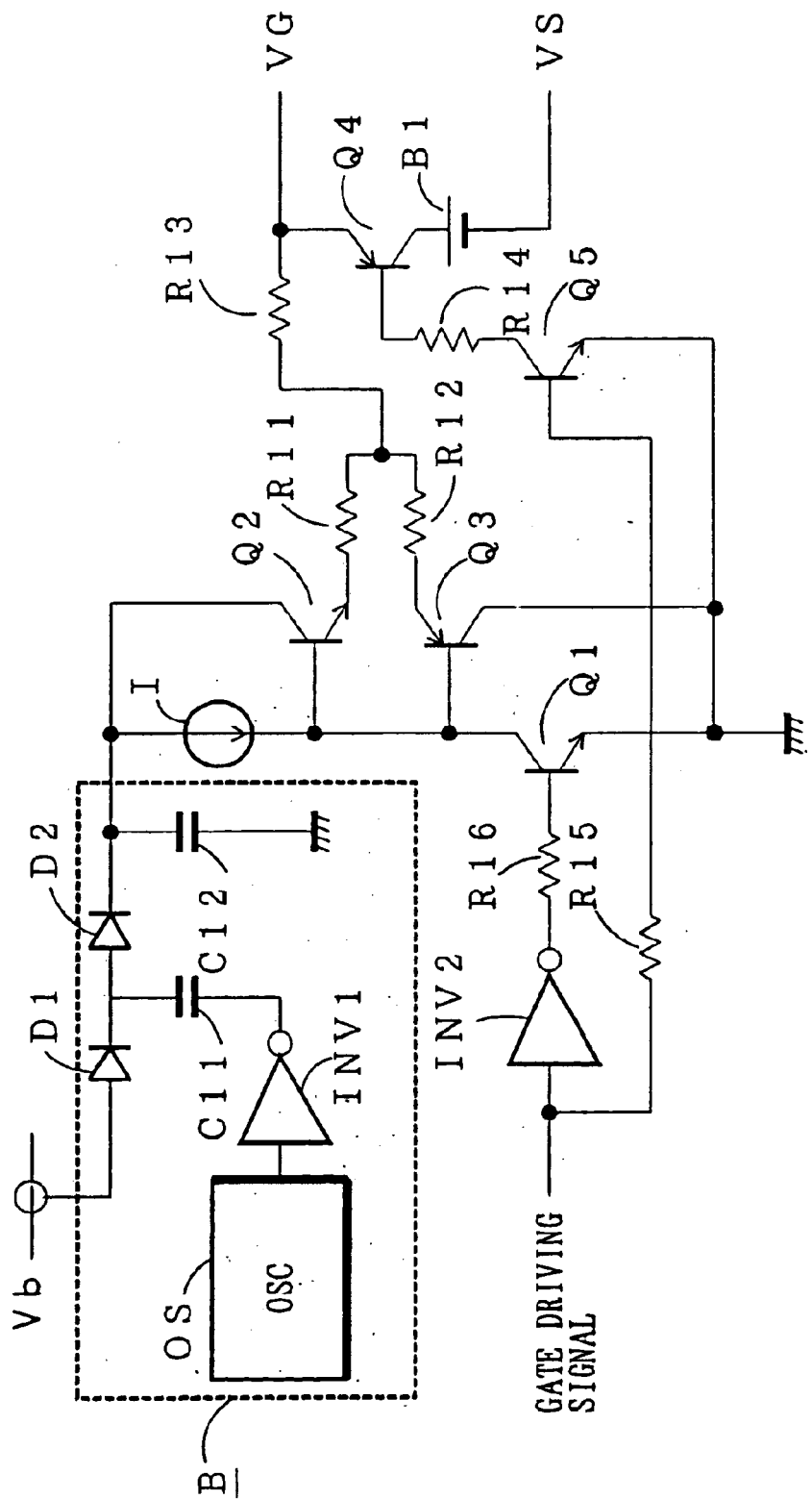
FIG. 7 is a circuit diagram of a level shifting circuit shown in FIG. 2.

The amplified output from the operational amplifier AMP is inputted to the inverting terminal (−) of a comparator CMP. The passed value, which is reduced by the level defined by a ratio of the resistor R3 to resistor R5, is inputted to the non-inverting input terminal (+) of the comparator CMP. As a result, when the amplified output exceeds a prescribed level (a value obtained by dividing the passed value of Vf by the ratio of the resistor R3 to R5), a transient heat interrupting signal at the H level is produced. The The level shift circuit LS is configured as shown in FIG. 7. In a (+) power line of a battery B, two diodes D1 and D2 are connected in series in the forward direction from a (+) power terminal. The one end of a capacitor C11 is connected to the junction point of the diodes D1 and D2. The other end of the capacitor C12 is connected to an inverter INV to which an oscillation signal from an oscillator OS is supplied.

Further, a capacitor C12 is connected between the cathode side of the diode D2 and ground. These elements constitute a voltage boosting circuit. The charges once stored in a capacitor C11 is stored in the capacitor C12 which provides a voltage higher than the battery voltage. The charges stored in the respective capacitors do not back flow toward the power terminal.

The collector and emitter of a transistor (NPN) Q1 are connected between the output side of the voltage boosting circuit and ground, whereas the base thereof is connected to the output from the inverter V2 through a resistor R16. A gate driving signal is inputted to the input terminal of the inverter INV.

The collector of the transistor Q1 is connected to the bases of transistors (NPN) Q2 and (PNP) Q3. The emitters of the transistors Q2 and Q3 are connected to each other through resistors R11 and R12. The collector of the transistor Q2 is connected to the (+) line, whereas the collector of the transistor Q3 is connected to the ground line.

The junction point of the resistors R11 and R12 is connected to the emitter of a transistor (PNP) Q4 through a resistor R13 and also connected to the gate of the MOSFET Q. The collector of the transistor Q4 is connected to the source of the MOSFET Q through a battery B1.

The base of the transistor Q4 is connected to the collector of a transistor Q5 through a resistor 14. The emitter of the transistor Q5 is connected to the ground, whereas the base thereof is connected to the input terminal of the inverter INV2 for inputting a gate driving signal through a resistor R5.

In the operation of the level shift circuit LS, the voltage boosting circuit prepares a charged voltage higher than a battery voltage in such a manner that when the oscillator OS oscillates, charges are intermittently stored in the capacitor C11 and further stored in the capacitor C12. In this state, if the gate driving signal at the H level is applied to the inverter INV, the output from the inverter INV2 becomes the L level so that the transistor Q1 turns OFF. As a result, the positive voltage from the capacitor C12 is applied to the base of the transistor Q2 so that the transistor Q2 turns ON.

At this time, the transistors Q5 and Q4 are in the ON state as a result of the gate driving signal at the H level. Therefore, the charges stored in the capacitor 12 are applied to the gate of the MOSFIET Q as a gate voltage VG through the transistor Q2, resistors R11, R13 and transistor Q4. The voltage resulting from superposition of the battery B1 on the charges stored in the capacitor C12 is applied to the source of the MOSFET Q. Thus, the voltage enough to turn on the MOSFET Q is applied between the gate and source of the MOSFET Q.

The gate driving voltage at the L level is inverted into the H level by the inverter INV2 so that the transistor Q1 turns ON. Thus, the base of the transistor Q3 becomes the ground level so that the transistor Q3 turns ON. Thus, the gate voltage terminal of the level shift circuit LS falls into the ground level through the transistor Q3. As a result, the MOSFET Q turns OFF.

An explanation will be given of the operation of an in-vehicle load drive-controlling device according to this embodiment.

(1) Normal Operation

When the switch SW for driving the load is turned on, the gate control circuit GC supplies a gate driving signal to the level shift circuit LS shown in FIG. 7. In response to the gate driving signal, the level shift circuit LS boosts the battery voltage, thereby supplying the gate voltage VG and the source voltage VS enough to turn on the MOSFET Q surely to the MOSFET Q. Thus, the MOSFET Q is surely turned on so that the current from the battery B is supplied to drive the load.

In this way, since the voltage is applied between the gate and source of the MOSFET Q through the level shift circuit LS, the driving voltage for the MOSFET Q can be assured without using a dedicated power source.

(2) Protection Operation

1. Current Limiting Operation

Initially, a rush current which is about ten times as large as a normal current flows through an electric load such as a lamp or motor. In order that the rush current does not break the MOSFET, traditionally, the large current capacity of the MOSFET or the large diameter of an electric wire has been employed.

However, in accordance with this invention, the current capacity of the MOSFET Q or the diameter of the electric wire can be optimized to a small value so that the rush current is limited.

FIG. 8 is a graph showing the operation of limiting the rush current.

As seen from FIG. 8, when the switch SW is turned ON, the MOSFET turns on so that the gate driving signal is produced. At this time, the load current tends to flows as the rush current. However, as seen from FIG. 4, the MOSFET Q shifts into the saturated zone so that the load current is limited to a prescribed limited current as shown in FIG. 8.

At this time, in response to the heat liberation of the MOSFET Q, the forward voltage Vf of the diode D10, D20 incorporated in the MOSFET Q abruptly falls. When the fall of the forward voltage Vf reaches a transient heat threshold value, the transient heat detecting circuit DT2 to which the forward voltage Vf has been applied supplies a transient heat interrupting signal to the gate control circuit GC so that the gate driving signal is interrupted. It should be noted that the transient threshold value is set at a value sufficiently smaller than the value where the MOSFET Q and wiring of the load circuit is thermally broken.

When the gate driving signal is interrupted, the MOSFET Q turns off so that the source current (load current) is interrupted. When the load current is interrupted, the heat liberation of the MOSFET Q stops. Thus, the heat on the surface of the chip constituting the MOSFET Q dissipates so that the forward-voltage Vf across the diodes increases. Thus, the forward voltage Vf is substantially restored to an initial value until when the gate driving signal is produced again. When the gate driving signal is produced again after a predetermined timer period td elapses, the same current limiting operation is repeated.

When the rush current is repeated several times, the status of the load L gradually approaches to a stationary state so that the abrupt reduction of the forward voltage Vf is cancelled. As a result, the transient heat interrupting signal becomes OFF so that the current limiting operation stops and the normal operation starts. Thus, the gate driving signal is continuously produced. It should be noted that the transient heat interrupting threshold value is set at a small value so that the rush current limiting operation (slow starting operation) is carried out within the range of a rated temperature of the MOSFET Q.

When the light bulb is turned on again in the state where the filament has been already wormed up (for example, the blinking of the bulb has been repeated), the current is initially low so that the rush current does not flow. Therefore, the current limiting operation is not activated so that the bulb turns on instantaneously. In this way, the current limiting operation according to this invention, which a slow starting operation due to a closed loop control, can drive the load stably without being affected by the temperature of the load, a variation in the power supply voltage and a variation in the load. In addition, the long life of the load can be assured by the current limitation and slow starting.

The transient heat threshold value may be set at a different value from that in the stationary state during only the period while the rush current flows. During the period while the rush current flows, the current limiting value may be set at a different value from that in the stationary state by controlling the gate-source voltage Vgs. Further, according to the kind of the load, during the period while the rush current flows, the ON/OFF operation of the load current is inhibited to accelerate the rise of the load.

2. Short-Circuiting Protecting Operation

An explanation will be given of the operation when an abnormal current flows owing to short-circuiting of the load circuit. When the wiring between the MOSFET and load is short-circuited to the chassis ground or both ends of the load is short-circuited, as seen from FIG. 9, a larger load current tends to flow as an abnormal current. However, the excessively large current is limited to the prescribed current limited value by the current limiting operation.

At the time of short-circuiting, the load resistance is reduced to a lower value than at the time of the rush current flowing. Therefore, the MOSFET is saturated more deeply. The temperature rise due to heat liberation also becomes abrupt and the current is interrupted in a shorter time.

After the timer period td has elapsed, the MOSFET Q is turned on by the gate driving signal. In this case, if the short-circuited state is continuing, the forward voltage Vf repeatedly exceeds the transient heat threshold value to produce the transient heat interrupting signal. When the transient heat interrupting signal is counted by a prescribed number of times by the transient heat detecting circuit DT2, it is decided that the abnormal current due to short-circuiting has flowed. Thereafter, even when the switch remains ON, the gate driving signal is interrupted so that the state with the load current interrupted is kept. The release of the interrupted state can be performed by turning on the switch, turning off the power source, resetting operation, etc.

The number of times of counts for deciding the short-circuiting is set as a much larger number-than that of the transient heat interrupting signal in the normal operation of limiting the rush current. As a result, the short-circuiting interrupting operation can be performed stably without performing the complicated operation of inhibiting the counting of the transient heat interrupting signal for a certain period in order to discriminate the transient heat interrupting operation at the time of the rush current flowing from that at the time of the short-circuiting.

FIG. 10 is a timing chart of a protection operation when the MOSFET excessively generates heat. When the load current increases abnormally owing to the abnormality of the load within a range not reaching the current limited value, the temperature of the MOSFET rises gradually. When the absolute value of the forward voltage Vf lowers to the overheat interrupting threshold value owing to this temperature rise, the overheat detecting circuit DT1 supplies the overheat abnormality interrupting signal to the gate control circuit GC to stop the gate driving signal. It should be noted that the overheat interrupting threshold value is set at a temperature of thermally breaking the MOSFET by an excess current.

The MOSFET Q is automatically restored from the excessive heated interrupted state in such a manner that the stopping of the gate driving signal in the gate control circuit GC is released by turning on the power source again, or otherwise the absolute value of the forward voltage Vf rises from the overheat threshold value so that the overheat abnormality interrupting signal which is an output from the comparator CMP constituting the overheat detecting circuit DT1 is inverted into L so that the gate driving signal is produced.

Incidentally, the input of the comparator CMP has a hysteresis characteristic so that even when the forward voltage Vf slightly exceeds the excessive heat interrupting threshold value, the gate driving signal is not produced.

Embodiment 2

Figure 11:
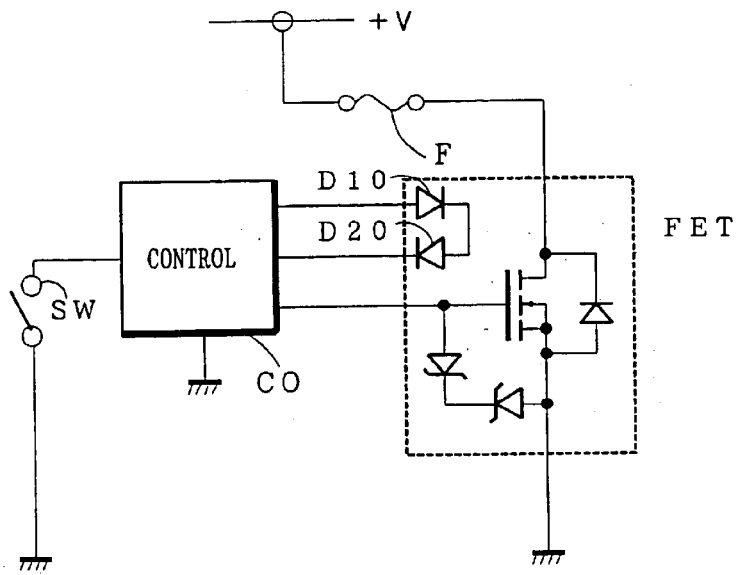
FIG. 11 is a block diagram of the in-vehicle electric load drive-controlling device according to the first embodiment of this invention.

In the first embodiment, the load was located between the source and ground. However, as shown in FIG. 11, the load may be arranged between the (+) power line and the drain through a fuse F. In this case, a sufficiently higher voltage than the ground level may be applied to the gate of the MOSFET so that the level shift circuit LS does not require the voltage boosting circuit such as a charge pump. Incidentally, it should be noted that this embodiment does not provide the protection against the wiring short-circuiting, but requires the protecting function using the fuse.

Embodiment 3

In the embodiments described above, a constant current is supplied to the load to drive it. However, this invention can be applied to a device for on-off controlling an in-vehicle lamp as a load by the high speed switching of the PWM signal having a prescribed duty ratio supplied to the gate of the MOSFET.

Figure 12:
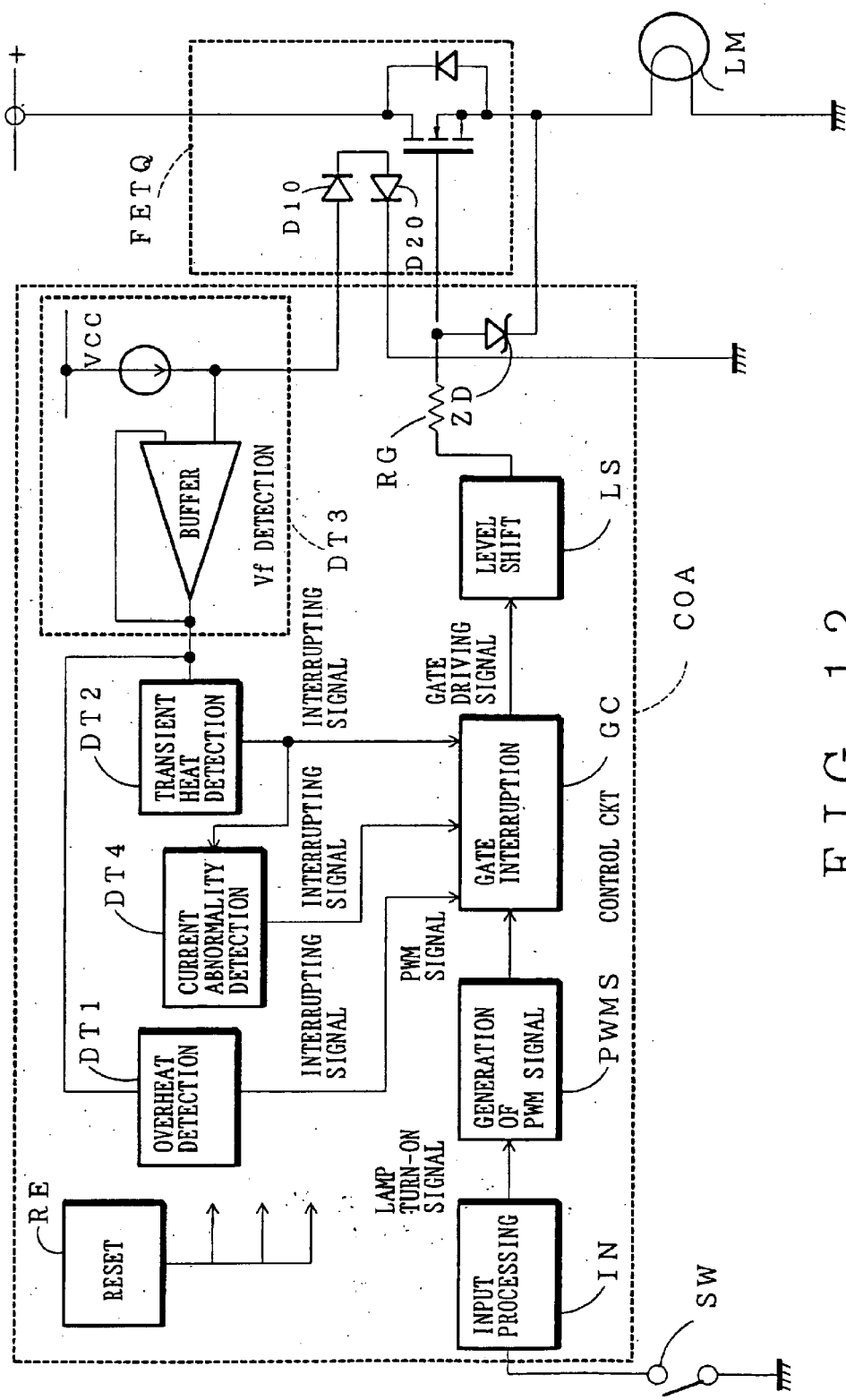
FIG. 12 is a detailed block diagram of the in-vehicle electric load drive-controlling device according to the second embodiment of this invention.

FIG. 12 is a block diagram of an in-vehicle electric load drive-controlling device according to the third embodiment of this invention. In FIG. 12, like reference numerals refer to like parts in FIG. 2. In FIG. 12, COA denotes a control circuit in this embodiment. In addition to the configuration of the control circuit according to the first embodiment, the device according to this embodiment includes an input processing circuit IN, a PWM signal generating circuit PWMS, a gate interruption circuit GC, a level shift circuit LS, a current abnormality detecting circuit DT4, an overheat detecting circuit DT1 (first embodiment), a transient heat detecting circuit DT2 (first embodiment), and a reset circuit RE. The input processing circuit IN serves to produce a lamp turn-on signal when the switch SW for driving the in-vehicle lamp as a load is turned on. The PWM signal generating circuit serves to generate a PWMS signal for switching the MOSFET at a high speed in response to the lamp turn-on signal. The gate interrupting circuit GC serves to produce the gate driving signal for the MOSFET, which is pulsated on the basis of the PWM signal, and also interrupt the gate driving signal when it externally recieves an interrupting signal. The level shift circuit LS shifts the voltage level of the gate driving signal to the power source level or higher. The current abnormality detecting circuit DT4 counts the transient heat interrupting signal and produces a current abnormality interrupting signal when the transient heat interrupted state succeeds by a prescribed number of times. The reset circuit RE resets the interrupting signal produced from each of the detecting circuits DT1, DT2 and DT4 in response to a power-on-reset signal or a reset command from the outside.

The PWM signal generating circuit PWMS which is constructed of an oscillator and others produces pulses with a duty ratio with the effective power being equal to that of the lamp. For example, in the series connection of two batteries (24 V), the duty ratio is set at about 25%, and in the series connection of three batteries (36 V), the duty ratio is set at about 11%.

Figure 13:
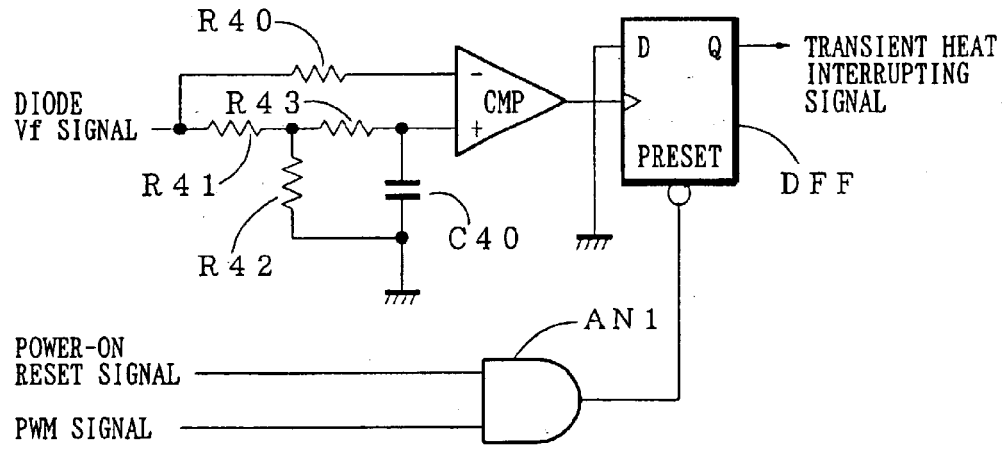
FIG. 13 is a circuit diagram of a transient heat detecting circuit shown in FIG. 12.

FIG. 13 shows the configuration of the transient heat interrupting circuit DT2.

The transient heat interrupting circuit DT2 produces a transient heat interrupting signal when the time change in the diode Vf signal exceeds a prescribed value and holds the transient heat interrupting signal until the reset command is received externally.

The diode Vf signal is an analog signal which varies with passage of time. This signal is divided at the resistance ratio of resistor R41 to resistor R42, and is stored as the passed value by a filter circuit composed of a resistor R43 and a capacitor C40. The present value of the diode Vf signal is inputted to the inverting input terminal (−) of a comparator, whereas the diode Vf signal stored in the filter is inputted to the non-inverting terminal (−) thereof. Therefore, in the comparator CMP, when the present value of the diode Vf signal exceeds the passed value thereof, the output signal at H level from the comparator CMP is supplied to a D-type flip-flop DFF. As a result, the transient heat interrupting signal at the H level is supplied from the Q terminal of the D type flip flop to the gate interrupting circuit GC so that the gate driving signal is produced to on-off control the lamp.

Further, the Vf detecting circuit detects a time changing rate of the forward voltage Vf whenever the gate driving signal by the PWM signal is supplied to the MOSFET. If the changing rate is large so that the forward voltage Vf falls from the transient heat interrupting threshold value, the transient heat interrupting circuit supplies the output signal at the H level from the comparator CMP to the D type flip flop. The D type flip-flop DFF supplies the transient heat interrupting signal at the L level (i.e., ground level) applied to the D terminal to the gate interrupting circuit GC.

Such an operation is carried out whenever the gate driving signal synchronous with the input PWM signal is supplied to the MOSFET so that the transient heat interrupting signal synchronous with the PWM signal is produced until the time changing rate of the forward voltage Vf exceeds the transient heat threshold value. When the time changing rate exceeds the transient heat interrupting threshold value, the transient heat becomes OFF. Thus, the gate driving signal synchronous with the PWM signal is supplied to the MOSFET Q so that the lamp is stably turned on.

The transient heat interrupting signal is turned off in such a manner that when the PWM signal is inputted to an AND gate AN1 during the inputting period of a power-on-reset signal, the AND gate AN1 supplies a signal at L level synchronous with the PWM signal to the preset terminal of the D type flip-flop so that the transient heat interrupting signal which appears at the Q terminal becomes the L level.

Figure 16:
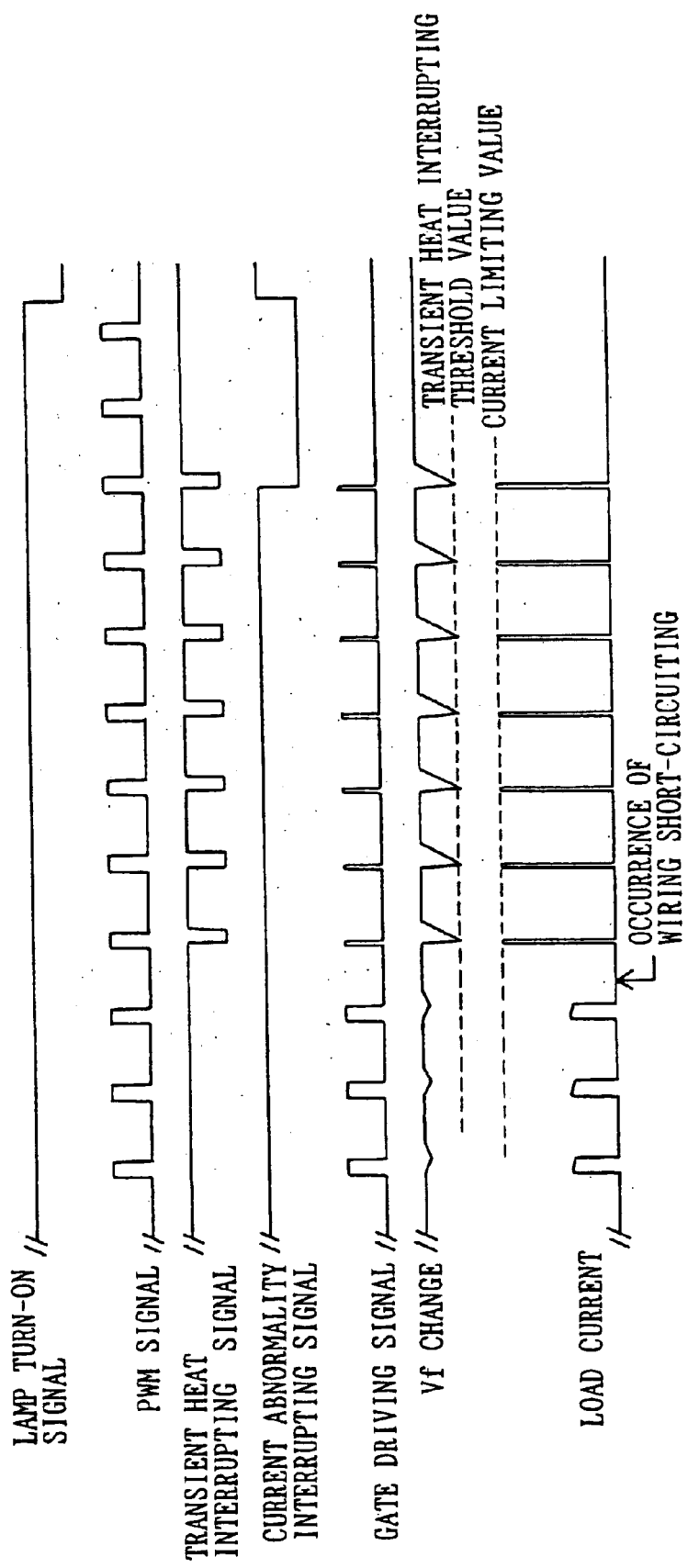
FIG. 16 is a waveform chart of control timings based on a variation of Vf when the protection from short-circuiting is performed in the second embodiment.

Although the circuit configuration is not shown, as seen from the timing chart of FIG. 16, the current abnormality detecting circuit DT4 counts the transient heat interrupting signal produced from the transient heat detecting circuit DT2, and when the number of counts reaches a prescribed number, it supplies an H level signal to a D-type flip-flop DFF. As a result, the current abnormality interrupting signal at the L level applied to the D terminal is supplied to the gate interrupting circuit GCA from the Q terminal.

The current abnormality interrupting signal is turned off in such a manner that during the inputting period of the power-on-reset signal to the AND gate AN1, the reset circuit RE supplies a current abnormality interruption releasing signal to the D-type flip-flop DFF.

Figure 14:
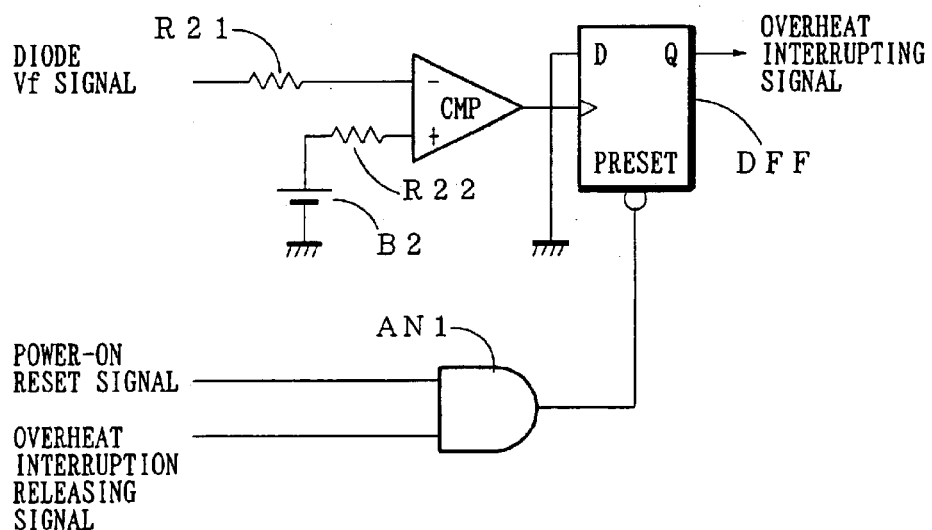
FIG. 14 is a circuit diagram of an overheat detecting circuit shown in FIG. 12.
Figure 17:
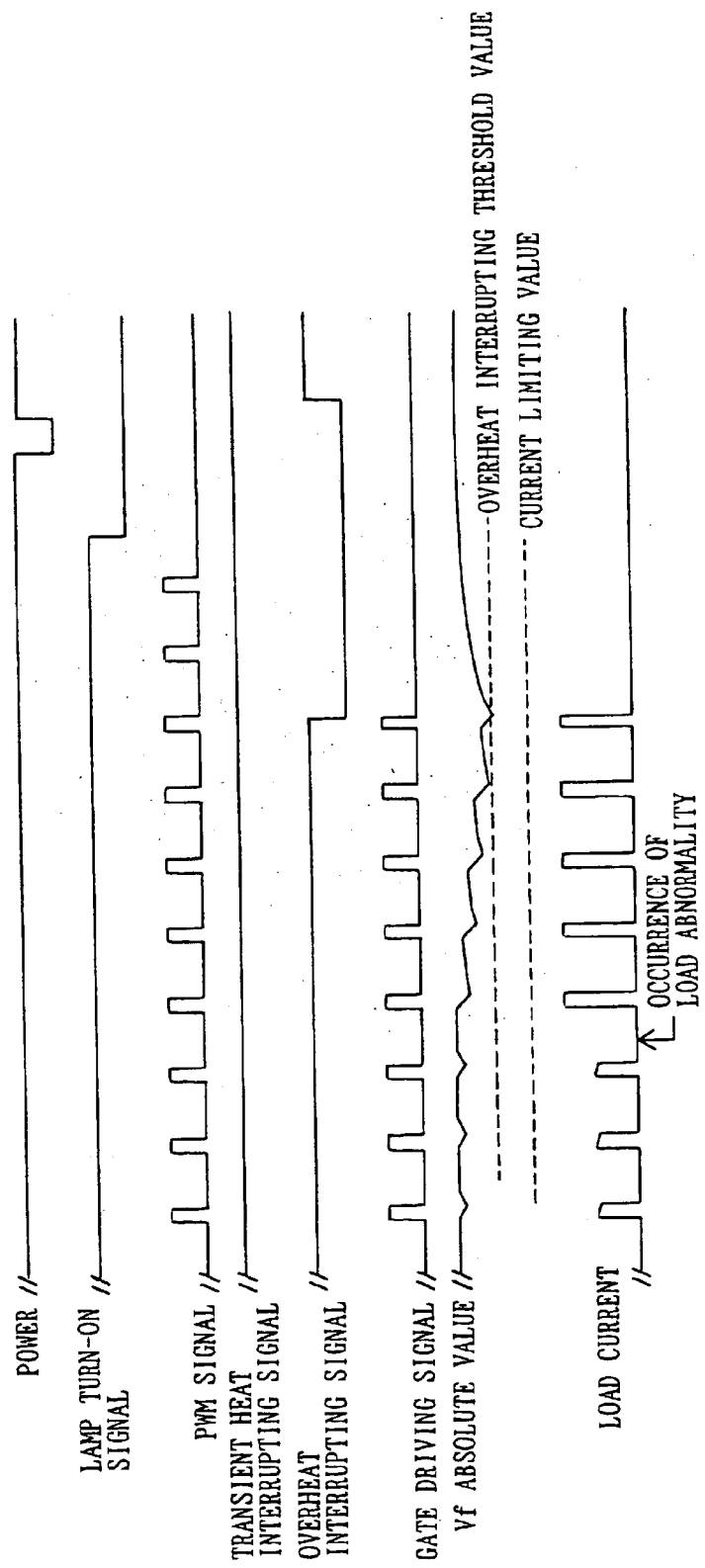
FIG. 17 is a waveform chart of timings of protection from overheat by the absolute value of Vf in the second embodiment.

The overheat interrupting circuit operates as follows. As seen from FIG. 17, when the forward voltage Vf applied to the inverting input terminal (−) of a comparator CMP through a resistor R22 as shown in FIG. 14 falls from the overheat interrupting threshold value B2 applied to the non-inverting input terminal (+) through a resistor R22, an H level signal is supplied from a comparator CMP to a D-type flip-flop DFF, and an overheat abnormality interrupting signal at an L level which is the ground level applied to the D terminal is supplied from the Q terminal to the gate interrupting circuit GC.

The overheat abnormality interrupting signal is turned off in such a manner that during the inputting period of the power-on-reset signal to the AND gate AN1, when an overheat interruption releasing signal is supplied from the reset circuit RE to the AND gate AN1, an L level signal is supplied from the AND gate AN1 to the preset terminal of the D type flip-flop DFF so that the overheat abnormality interrupting signal at the Q terminal is reset.

In this embodiment also, as in the first embodiment, the operations of limiting the rush current, protection against short-circuiting and protection from overheating, etc. However, the protection against short-circuiting and protection from overheating are carried out in the same manner as in the first embodiment. Therefore, only the operation of limiting the rush current will be explained.

Figure 15:
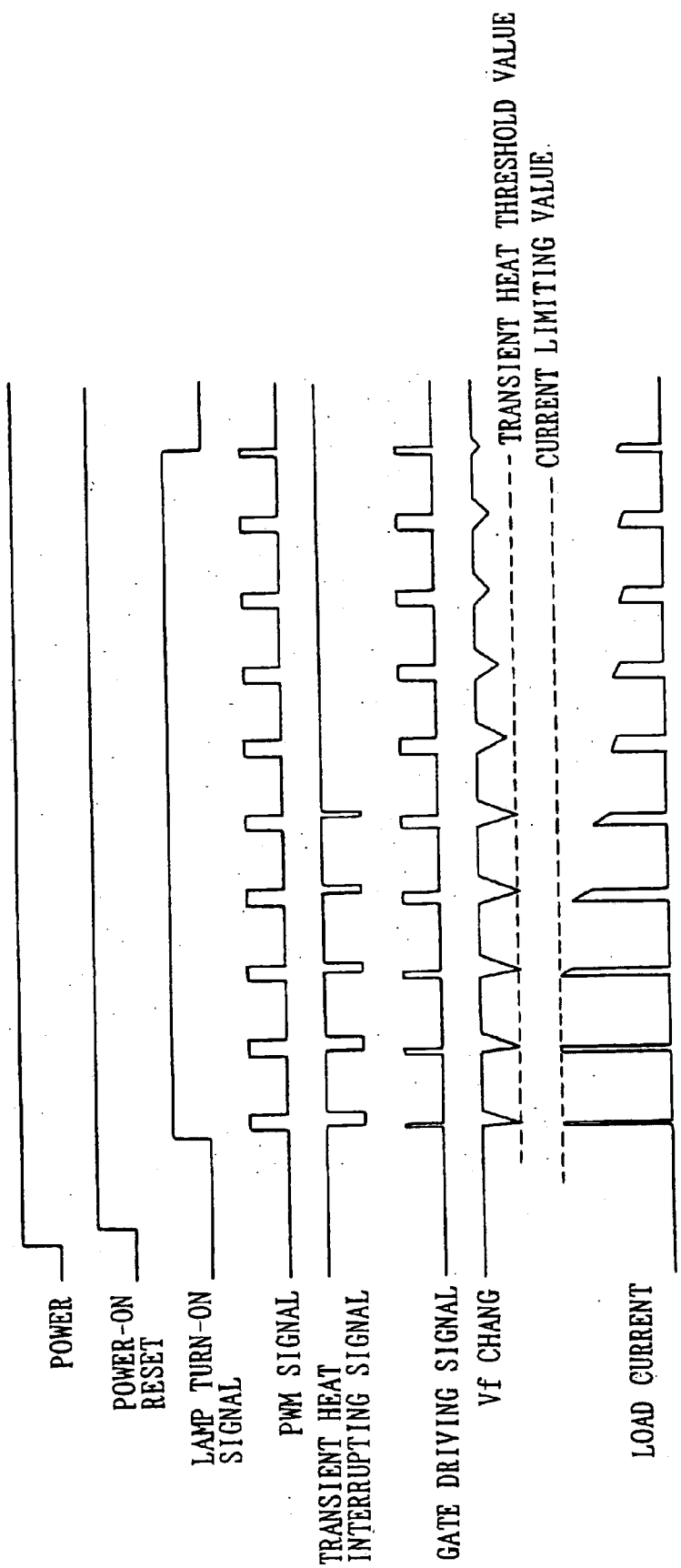
FIG. 15 is a waveform chart of control timings based on a variation of Vf when a rush current is limited in the second embodiment.

FIG. 15 is a timing chart for explaining the operation of limiting the rush current.

As seen from FIG. 12, in response to turn-on of the switch SW, when a lamp turn-on signal is supplied from the input processing circuit Into the PWM signal generating circuit PWMS, a PWM signal is supplied from the PWM signal generating circuit PWMS to the gate interrupting circuit GC.

The gate interrupting circuit GC supplies the PWM-modulated gate driving signal to the gate of the MOSFET through the level shift circuit. Then, the MOSFET Q makes high speed switching so that a power source voltage is applied to the lamp LM to pass a current through the lamp LM. Initially, the filament of the lamp is cool and in a low resistance state so that the rush current as the load current tends to flow the lamp LM. However, as seen from FIG. 4, the MOSFET Q shifts into the saturated zone so that the load current is limited to a prescribed limited current as shown in FIG. 15.

At this time, in response to the heat liberation of the MOSFET Q, the forward voltage Vf of the diode D10, D20 incorporated in the MOSFET Q abruptly falls. When the quantity of fall of the forward voltage Vf reaches a transient heat threshold value, the transient heat detecting circuit DT2 supplies a transient heat interrupting signal to the gate control circuit GC so that the gate driving signal is interrupted. It should be noted that the transient threshold value is set at a value sufficiently smaller than the value where the filament of the lamp LM is thermally broken.

When the gate driving signal is interrupted, the MOSFET Q turns off so that the load current to the lamp LM is interrupted. When the load current is interrupted, the heat liberation of the MOSFET Q stops. Thus, the heat on the surface of the chip constituting the MOSFET Q dissipates so that the forward voltage Vf of the diodes increases. Thus, the forward voltage Vf is approximately restored to an initial value until when the gate driving signal is produced again.

In response to the subsequent PWM signal, the same current limiting operation is repeated. However, since the temperature of the filament gradually rises, the resistance of the filament approaches a steady-state value. Therefore, the rush current falls whenever the PWM signal is supplied, and when the amount of fall in the forward voltage due to heat liberation becomes lower than the transient heat interrupting signal, the current limiting operation by the transient heat interrupting signal is stopped. Thus, the MOSFET Q is on/off operated with a stationary duty ratio to turn on/off the lamp LM.

Embodiment 4

Figure 18:
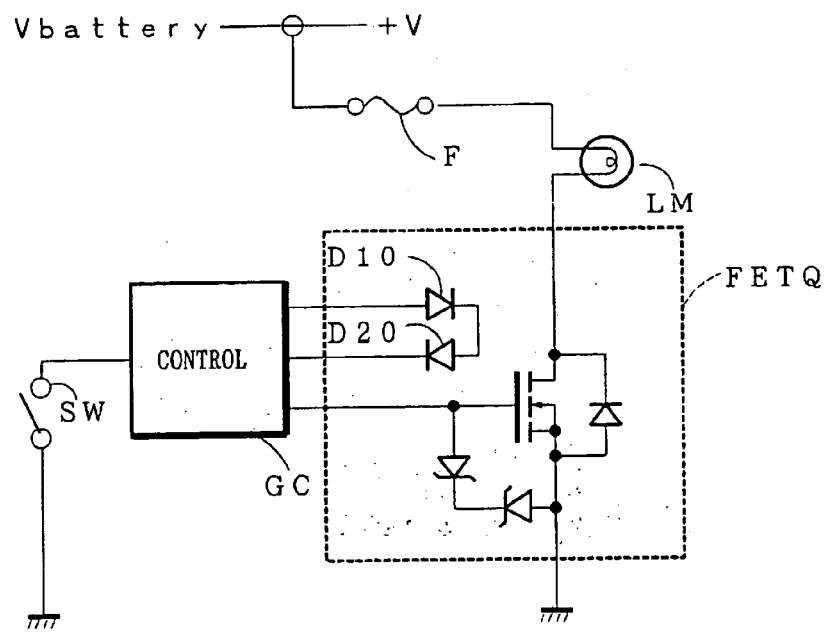
FIG. 18 is a block diagram of the in-vehicle electric load drive-controlling device according to the third embodiment of this invention.

In the third embodiment, the load was located between the source and ground. However, as shown in FIG. 18, the load may be arranged between the (+) power line and the drain through a fuse F. In this case, a sufficiently higher voltage than the ground level may be applied to the gate of the MOSFET so that the level shift circuit LS does not require the voltage boosting circuit such as a charge pump. Incidentally, it should be noted that this embodiment does not provide the protection against the wiring short-circuiting, but requires the protecting function using the fuse.

Figure 4:
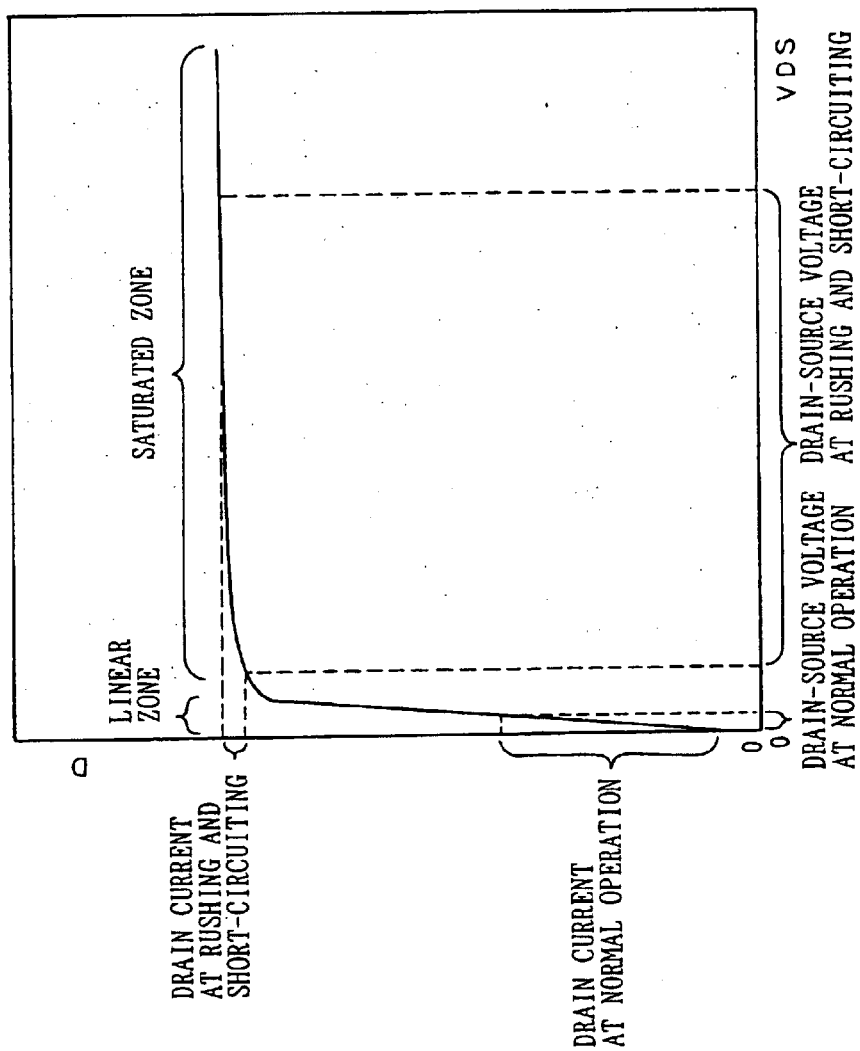
FIG. 4 is a graph showing a Vds-ID characteristic of the MOSFET shown in FIG. 3.

In the first and third embodiments, the drain current was shifted to the saturated region to perform various control operations. However, as shown in FIG. 4, in the linear region, the control operation may be performed. Namely, in the linear zone operation also, when the current increases, the heat liberation of the MOSFET increases so that the amount of fall in the forward voltage Vf increases. In this case, by making the interruption at a prescribed threshold value, abnormal heat liberation can be suppressed. Incidentally, the function of limiting the current is lost, the effect of lengthening the load or lamp is reduced.

Embodiment 5

Figure 19:
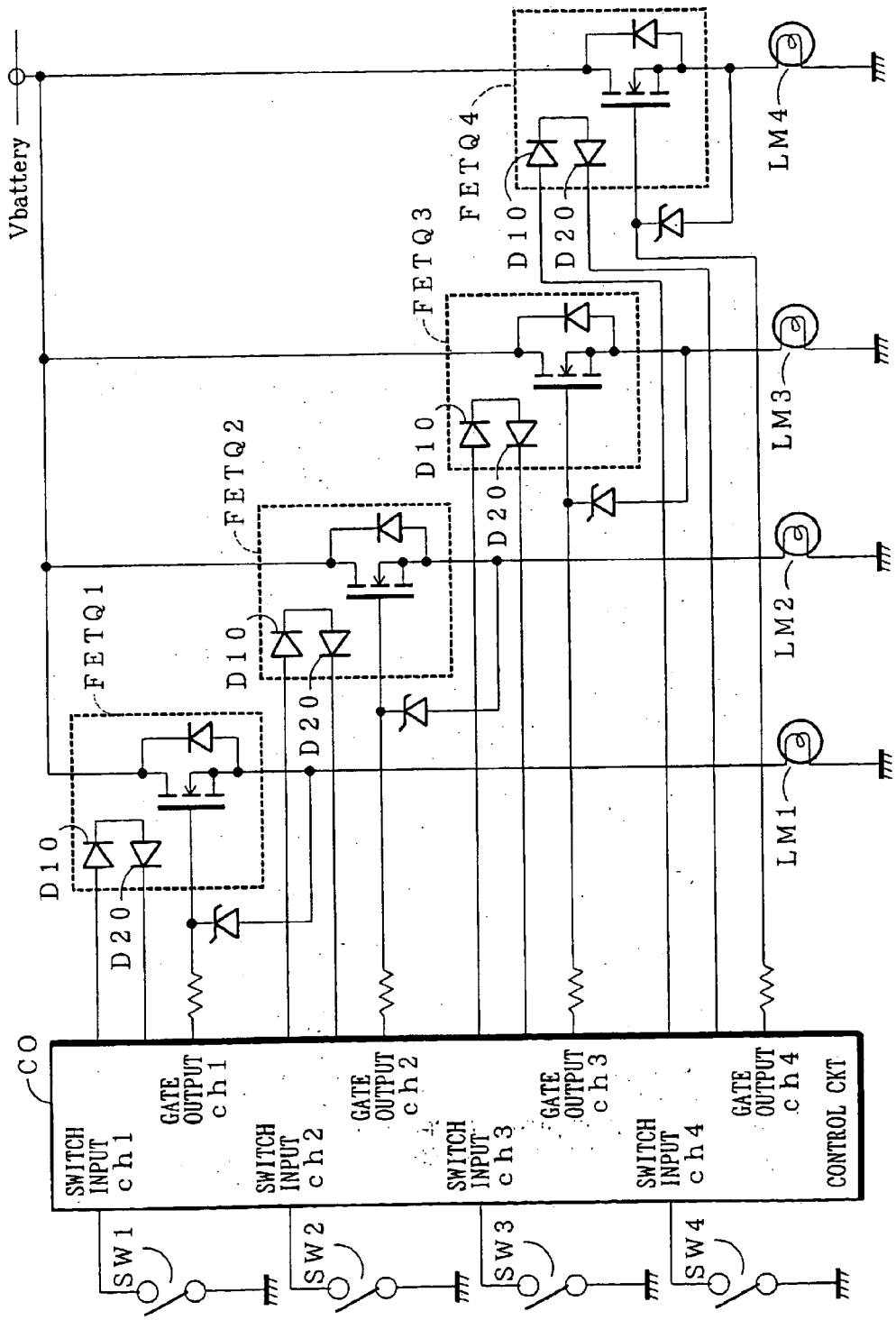
FIG. 19 is a block diagram of the in-vehicle electric load drive-controlling device according to the fifth embodiment of this invention.

In the third embodiment, the single lamp was on-off controlled by the MOSFET Q. However, as seen from FIG. 19, a plurality of lamps LM1 to LM4 may be on/off controlled at slight intervals over time by the control circuit CO. In the configuration of FIG. 19, the control circuit as shown in FIG. 12 may be provided for each of the lamps. Otherwise, the gate driving signals based on the single PWM signal may be supplied at slight intervals over time to the gates of the MOSFETs Q1 to Q14 from the gate output channels ch1 to ch4.

Figure 20:
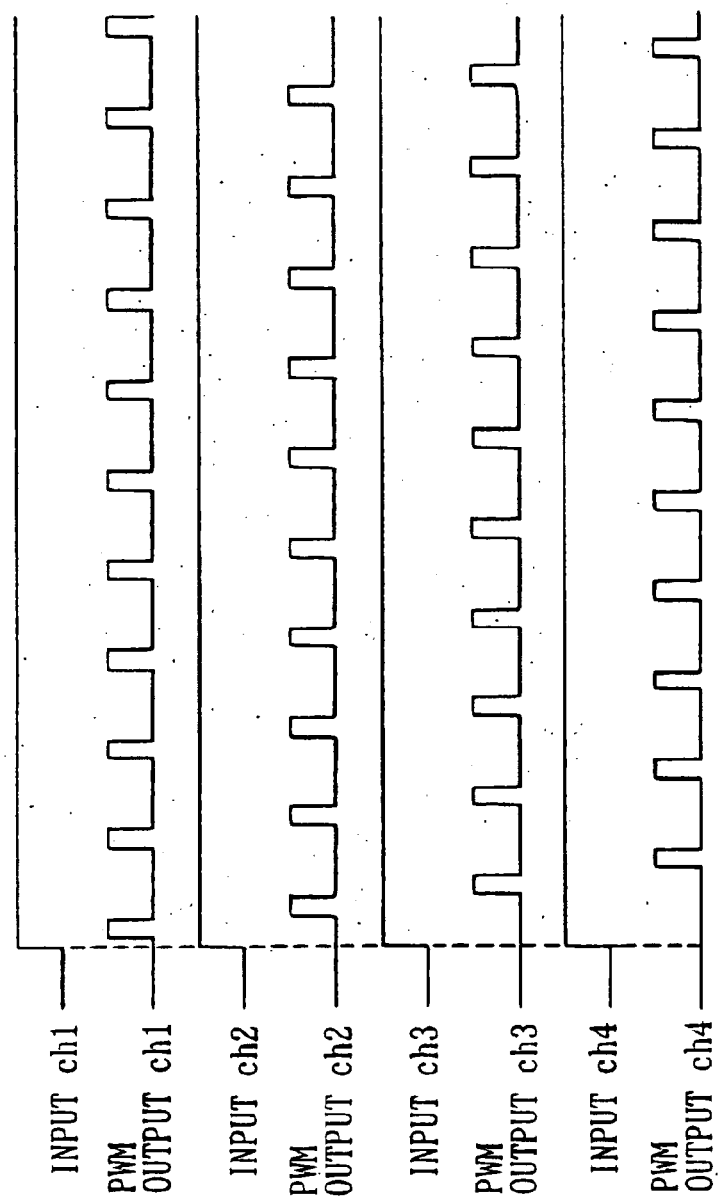
FIG. 20 is a timing chart of output timings of a gate driving signal in a control circuit in the fifth embodiment of this invention.
Figure 21:
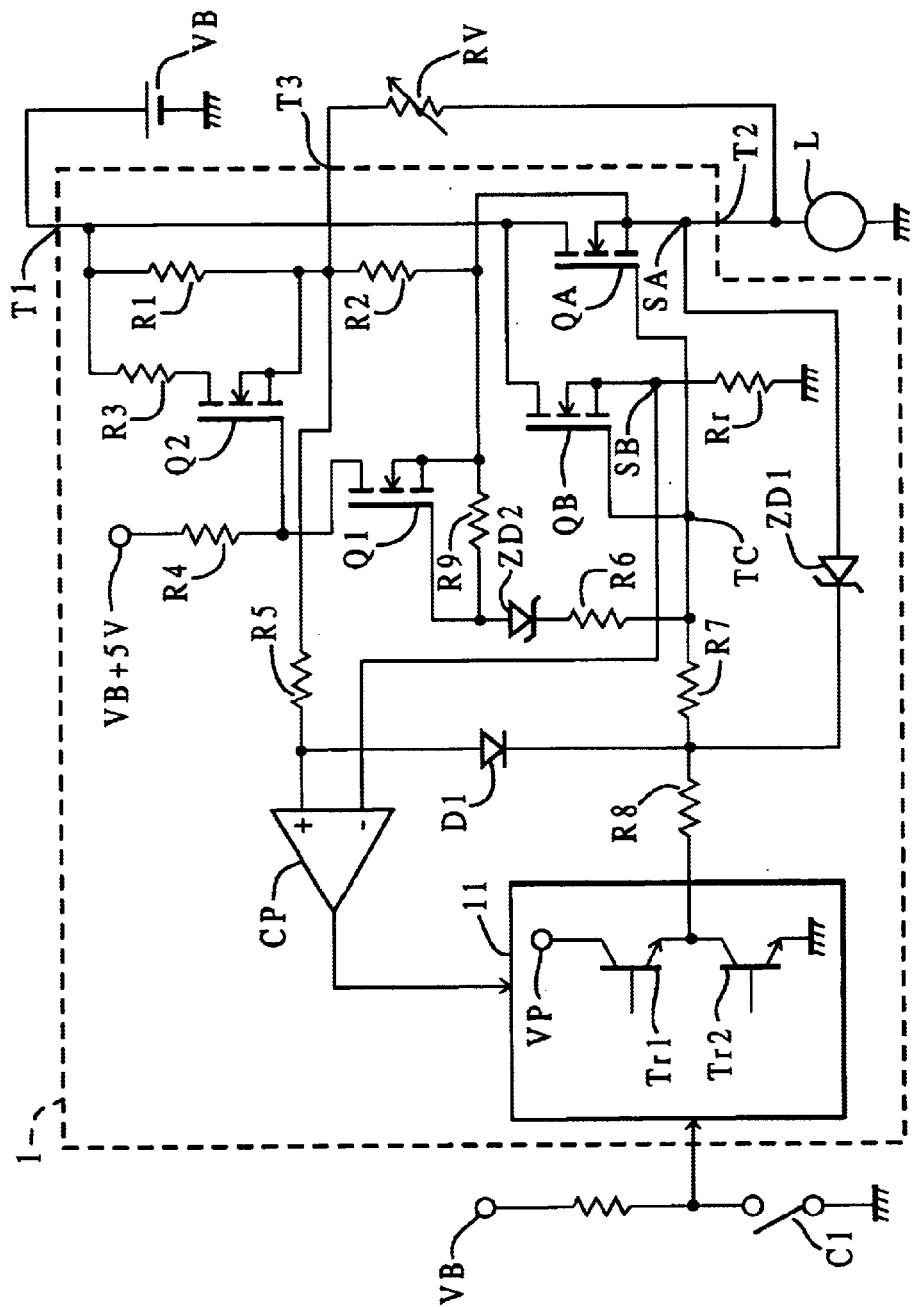
FIG. 21 is a circuit diagram showing a conventional excessive current detecting circuit and a protection circuit.

As seen from the timing chart shown in FIG. 20, when all the switches SW1 to SW4 are turned ON, the PWM modulated gate driving signals based on the single PWM signal is supplied at slight intervals over time to the gates of the MOSFETs Q1 to Q14 from the gate output channels ch1 to ch4. Then, the high speed ON/OFF operation is started so that the lamps LM1 to LM4 start to turn on.

In this way, where the plurality of lamps are on/off controlled, the PWM modulated gate driving signals, by supplying at slight intervals over time so that they do not overlap, the currents on the current lines are averaged so that the burden for the battery and the loss of the current lines is reduced. The radiation noise due to a current change can be reduced.

Incidentally, the contents of Japanese Patent Appln. No. 2000-055280 are hereby incorporated by reference.

What is claimed is:

1. An in-vehicle load drive-control circuit comprising:
   a power MOSFET connected in series between a load and a power source, the power MOSFET on/off controlling the power supply to the load, said power MOSFET incorporating a thermoelectric element across which a voltage drop occurs as a result of heat liberation when the power MOSFET is energized; and
   a control means for ON/OFF controlling a gate driving signal to said power MOSFET on the basis of the voltage drop,
   wherein after the voltage has been stabilized, the gate driving signal is made constant,
   wherein said thermoelectric element is electrically insulated from a source electrode of said power MOSFET, and
   wherein said power MOSFET is configured as a vertical DMOS structure consisting of a MOSFET and a diode, serving as a thermoelectric element, which are formed monolithically.

2. An in-vehicle load drive-controlling circuit according to claim 1, wherein said control means comprises a rush current detecting unit for detecting a rush current to the load on the basis of a time changing rate of the voltage drop to produce an interrupting signal for the gate driving signal to the power MOSFET.

3. An in-vehicle load drive-controlling circuit according to claim 2, wherein the control means comprises an abnormal current detecting unit for deciding an excess current resulting from poor wiring when the number of times of detecting the rush current by said rush current detecting unit is more than a prescribed number to produce an interrupting signal for the gate driving signal to the power MOSFET.

4. An in-vehicle load drive-controlling circuit according to claim 2, wherein the rush current detecting unit produces the gate driving signal at intervals while a load current is suppressed to less than a prescribed current after the voltage across the thermoelectric element has dropped to a prescribed voltage to repeat an ON/OFF operation of the power MOSFET so that the voltage is increased by a certain degree by heat dissipation of the power MOSFET.

5. An in-vehicle load drive-controlling circuit according to claim 2, wherein the rush current detecting unit produces the gate driving signal at intervals while a load current is suppressed to less than a prescribed current after the voltage across the thermoelectric element has dropped to a prescribed voltage to repeat an ON/OFF operation of the power MOSFET, and ON/OFF operation of energization of a load is repeated so that heat liberation of the load is stabilized to make resistance constant.

6. An in-vehicle load drive-controlling circuit according to claim 1, wherein the control unit comprises an overheat detecting unit for detecting overheat abnormality of the power MOSFET when said voltage drops to produce an interrupting signal for the gate driving signal.

7. An in-vehicle load drive-controlling circuit according to claim 6, wherein the overheat detecting unit decides restoration of the overheat abnormality of the power MOSFET when the voltage rises, thereby producing the gate driving signal.

8. An in-vehicle load drive-controlling circuit according to claim 1, wherein the thermoelectric element is a diode whose forward voltage increases with an increase in an ambient temperature.

9. An in-vehicle load drive-controlling circuit according to claim 1, further comprising a plurality of power MOSFETs for driving a plurality of loads, respectively, and said control unit supplies gate driving signals at slight intervals over time to the gates of these MOSFETs.

10. An in-vehicle load drive-controlling circuit according to claim 1, wherein said control unit supplies the gate driving signal based on a PWM signal to the power MOSFET.

* * * * *